United States Patent
Mishra et al.

(10) Patent No.: US 9,875,209 B2
(45) Date of Patent: Jan. 23, 2018

(54) SYNCHRONOUS DATA-LINK THROUGHPUT ENHANCEMENT TECHNIQUE BASED ON DATA SIGNAL DUTY-CYCLE AND PHASE MODULATION/DEMODULATION

(71) Applicant: QUALCOMM Incorporated, San Diego, CA (US)

(72) Inventors: Lalan J. Mishra, San Diego, CA (US); Dexter T. Chun, San Diego, CA (US); Animesh Datta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 117 days.

(21) Appl. No.: 13/887,846

(22) Filed: May 6, 2013

(65) Prior Publication Data

US 2014/0330994 A1 Nov. 6, 2014

(51) Int. Cl.
| | |
|---|---|
| G06F 13/42 | (2006.01) |
| G11C 7/22 | (2006.01) |
| G11C 7/10 | (2006.01) |
| G06F 13/16 | (2006.01) |
| H04L 7/00 | (2006.01) |
| H04L 25/49 | (2006.01) |

(52) U.S. Cl.
CPC .......... G06F 13/42 (2013.01); G06F 13/1689 (2013.01); G06F 13/4234 (2013.01); G06F 13/4243 (2013.01); G06F 13/4282 (2013.01); G11C 7/10 (2013.01); G11C 7/222 (2013.01); H04L 7/0008 (2013.01); H04L 7/0037 (2013.01); H04L 25/4902 (2013.01)

(58) Field of Classification Search
None
See application file for complete search history.

(56) References Cited

U.S. PATENT DOCUMENTS

| | | | | |
|---|---|---|---|---|
| 5,297,869 A | * | 3/1994 | Benham | H03L 7/07 327/231 |
| 5,805,632 A | * | 9/1998 | Leger | H04L 25/4904 341/55 |
| 6,064,697 A | | 5/2000 | Yoshikawa | |
| 6,603,706 B1 | * | 8/2003 | Nystuen | G11C 7/1051 365/230.04 |
| 6,625,682 B1 | * | 9/2003 | Simon et al. | 710/305 |

(Continued)

FOREIGN PATENT DOCUMENTS

WO  WO 2007125519 A2 * 11/2007

OTHER PUBLICATIONS

'Double Data Rate' article from Wikipedia, archive from Mar. 21, 2013.*

(Continued)

*Primary Examiner* — Steven Snyder
(74) *Attorney, Agent, or Firm* — Qualcomm Incorporated-Toler (57) ABSTRACT

A synchronous data-link throughput enhancement technique based on data signal duty-cycle and phase modulation demodulation is disclosed. A method includes receiving multiple bits to be transmitted, encoding the multiple bits to generate a multi-bit signal that represents the multiple bits, and transmitting, via a synchronous interface, the multi-bit signal during a time period that corresponds to one-half of a cycle of a synchronization signal.

35 Claims, 7 Drawing Sheets

(56) References Cited

U.S. PATENT DOCUMENTS

| | | | |
|---|---|---|---|
| 6,636,166 B2* | 10/2003 | Sessions et al. | 341/63 |
| 6,690,309 B1* | 2/2004 | James | H03M 7/20 |
| | | | 341/102 |
| 6,697,420 B1* | 2/2004 | Simon et al. | 375/220 |
| 6,775,324 B1* | 8/2004 | Mohan et al. | 375/238 |
| 7,075,996 B2* | 7/2006 | Simon et al. | 375/259 |
| 7,080,186 B2* | 7/2006 | Simon et al. | 710/305 |
| 7,103,793 B2 | 9/2006 | Rentschler et al. | |
| 7,178,048 B2 | 2/2007 | Smith et al. | |
| 7,184,508 B2* | 2/2007 | Emberling | G11C 7/1066 |
| | | | 375/372 |
| 7,233,543 B2 | 6/2007 | Smith et al. | |
| 7,363,422 B2* | 4/2008 | Perego | G06F 13/1684 |
| | | | 711/105 |
| 7,512,188 B1 | 3/2009 | Watson et al. | |
| 7,573,916 B1* | 8/2009 | Bechtolsheim | H04L 12/4641 |
| | | | 370/359 |
| 7,869,287 B2* | 1/2011 | Searles | G11C 7/1051 |
| | | | 365/193 |
| 8,134,878 B1* | 3/2012 | Shimanek et al. | 365/194 |
| 9,794,054 B2* | 10/2017 | Nandy | H04L 7/0008 |
| 2001/0009571 A1* | 7/2001 | Jeong et al. | 375/259 |
| 2004/0096016 A1* | 5/2004 | Choudhury et al. | 375/340 |
| 2004/0101060 A1 | 5/2004 | Simon et al. | |
| 2004/0186956 A1* | 9/2004 | Perego | G06F 13/1684 |
| | | | 711/115 |
| 2005/0077976 A1* | 4/2005 | Cohen et al. | 332/112 |
| 2005/0193163 A1* | 9/2005 | Perego et al. | 711/105 |
| 2005/0207255 A1* | 9/2005 | Perego et al. | 365/222 |
| 2006/0041854 A1 | 2/2006 | Schlanger et al. | |
| 2006/0093029 A1 | 5/2006 | Becker et al. | |
| 2006/0115016 A1 | 6/2006 | Chen et al. | |
| 2007/0291828 A1* | 12/2007 | Martin et al. | 375/219 |
| 2008/0229260 A1* | 9/2008 | Durham et al. | 716/1 |
| 2008/0279225 A1* | 11/2008 | Den Besten et al. | 370/503 |
| 2009/0106708 A1* | 4/2009 | Dagher et al. | 716/1 |
| 2009/0122856 A1* | 5/2009 | Baxter et al. | 375/239 |
| 2009/0255713 A1 | 10/2009 | Dangler et al. | |
| 2009/0300260 A1* | 12/2009 | Woo et al. | 710/316 |
| 2010/0027706 A1* | 2/2010 | Tanimoto et al. | 375/279 |
| 2010/0182042 A1* | 7/2010 | Law et al. | 326/38 |
| 2010/0188004 A1 | 7/2010 | Baggen et al. | |
| 2011/0063931 A1* | 3/2011 | Linam et al. | 365/193 |
| 2011/0239084 A1* | 9/2011 | Abbasfar | 714/758 |
| 2011/0258475 A1* | 10/2011 | Lee et al. | 713/401 |
| 2013/0021857 A1 | 1/2013 | Kizer et al. | |
| 2013/0088259 A1* | 4/2013 | Law et al. | 326/41 |
| 2017/0005780 A1* | 1/2017 | Nandy | H04L 5/00 |

OTHER PUBLICATIONS

'Interfacing FPGAs to HighSpeed DRAMs Puts Designers to the Test' by Lalitha Oruganti, Jun. 21, 2004.*

'Double Data Rate (DDR) SDRAM Specification' by JEDEC, Mar. 2003.*

'TN-46-05 General DDR SDRAM Functionality Technical Note' by Micron, copyright 2001.*

'Addressing Interleaved Multichannel Memory Challenges' by Drew Wingard, Aug. 20, 2009.*

Partial International Search Report for International Application No. PCT/US2014/035075, ISA/EPO, dated Aug. 29, 2014, 6 pages.

International Search Report and Written Opinion for International Application No. PCT/US2014/035075, ISA/EPO, dated Nov. 5, 2014, 16 pages.

* cited by examiner

SYNCHRONOUS DATA-LINK THROUGHPUT ENHANCEMENT TECHNIQUE BASED ON DATA SIGNAL DUTY-CYCLE AND PHASE MODULATION/DEMODULATION

I. FIELD

The present disclosure is generally related to transmitting and receiving data via a synchronous data-link using duty-cycle modulation and phase modulation.

II. DESCRIPTION OF RELATED ART

Memory devices, such as double data rate (DDR) synchronous dynamic random access memory (SDRAM) memory devices, utilize a synchronization signal (e.g., a clock signal) to transmit data to and to receive data from a processor. The synchronization signal may be an oscillatory signal that oscillates from a first value (e.g., a logical low value) to a second value (e.g., a logical high value). The synchronization signal may oscillate from the first value to the second value at a particular frequency. The synchronization signal and the data may be transmitted via a bus. A first bit of data may be transmitted to the memory device from the processor, or from the processor to the memory device, during a time when the synchronization signal has the first value (e.g., during a first half of a cycle of the synchronization signal). A second bit of data may be transmitted to the memory device from the processor, or from the processor to the memory device, during a time when the synchronization signal has the second value (e.g., during a second half of the cycle of the synchronization signal). Thus, the memory device may transmit two bits of data to, or receive two bits of data from, the processor during each cycle of the synchronization signal.

Increases in a rate at which the memory device (e.g. the DDR SDRAM) can transmit data to or receive data from the processor via the bus may be realized by increasing a frequency of the synchronization signal (i.e., reducing an amount of time for the synchronization signal to complete one cycle), which results in a corresponding increase in the rate at which the memory device transmits data to or receives data from the processor. This approach to increasing the rate at which the memory device transmits data to or receives data from the processor may require modification of the processor, the memory device, and a circuit board that includes a portion of the bus that carries the data and the synchronization signal. Each increase in the frequency of the synchronization signal may increase the cost to manufacture and the complexity of the processor, the memory device, and the circuit board.

III. SUMMARY

Modulating a phase of and/or a duty cycle of a multi-bit signal to be transmitted from, or received at a memory device using an internal clock signal that is not synchronized with a synchronization signal (e.g., an external clock signal) may increase the number of bits that may be transmitted during each cycle of the synchronization signal without requiring a corresponding increase to a frequency of the synchronization signal. Thus, data throughput increases may be realized without significantly increasing the complexity and manufacturing costs of the memory device, the processor, and a circuit board that includes a portion of a bus that is to carry the data and the synchronization signal from the processor to the memory device.

In a particular embodiment, a method includes receiving multiple bits to be transmitted. The method further includes generating a multi-bit signal that represents the multiple bits. The method further includes transmitting, via a synchronous interface, the multi-bit signal during a time period that corresponds to one-half of a cycle of a synchronization signal.

In another particular embodiment, an apparatus includes an input interface and signal generation logic. The input interface may be configured to receive multiple bits to be transmitted. The signal generation logic may configured to generate a multi-bit signal that represents the multiple bits, and to transmit, via a synchronous interface, the multi-bit signal during a time period that corresponds to one-half of a cycle of a synchronization signal.

In another particular embodiment, a computer-readable storage device includes instructions that, when executed by the processor, cause the processor to receive, via a bus, a multi-bit signal from a transmitter during a time period that corresponds to one-half of a cycle of a synchronization signal. The computer-readable storage device further includes instructions that, when executed by the processor, cause the processor to determine multiple bits represented by the multi-bit signal. The computer-readable storage device further includes instructions that, when executed by the processor, cause the processor to store the multiple bits at one or more storage elements of a memory device based on the synchronization signal.

In another particular embodiment, an apparatus includes means for receiving multiple bits to be transmitted. The apparatus further includes means for generating a multi-bit signal that represents the multiple bits. The apparatus further includes means for transmitting, via a synchronous interface, the multi-bit signal during a time period that corresponds to one-half of a cycle of a synchronization signal.

In another particular embodiment, a method includes a first step for receiving, via a bus, a multi-bit signal from a transmitter during a time period that corresponds to one-half of a cycle of a synchronization signal. The method further includes a second step for determining multiple bits represented by the multi-bit signal. The method further includes a third step for storing the multiple bits at one or more storage elements of a memory device based on the synchronization signal In another particular embodiment, a method includes receiving a data file comprising design information corresponding to a semiconductor device. The method further includes fabricating the semiconductor device according to the design information. The semiconductor device includes circuitry to encode or decode a multi-bit signal that represents multiple bits during a time period that corresponds to one-half of a cycle of a synchronization signal One particular advantage provided by at least one of the disclosed embodiments is that data throughput of a synchronous data-link (e.g., a bus carrying data and a synchronization signal), such as a synchronous data-link between a processor and a memory device (e.g., a double data rate (DDR) synchronous dynamic random access memory (SDRAM)), may be increased without significantly increasing the complexity and manufacturing costs of the memory device, the processor, and a circuit board that includes a portion of the synchronous data-link. For example, in at least one of the disclosed embodiments, two (2) or more bits of data may be transmitted from the processor to the memory device or from the memory device to the processor during a time period corresponding to one-half of a cycle of the synchronization signal, as compared to systems that transmit one bit of data during the time period corresponding to the one-half of the cycle of the synchronization signal. Another particular advantage of at least one of the disclosed embodiments, is that the throughput of the synchronous data-link may be increased without modifying a frequency of the synchronization signal, thus reducing the cost to manufacture and the complexity of the processor, the memory device, and the circuit board, as compared to the systems that increase the throughput of the synchronous data-link by increasing the frequency of the synchronization signal. Other aspects, advantages, and features of the present disclosure will become apparent after review of the entire application, including the following sections: Brief Description of the Drawings, Detailed Description, and the Claims.

V. DETAILED DESCRIPTION

Figure 1:
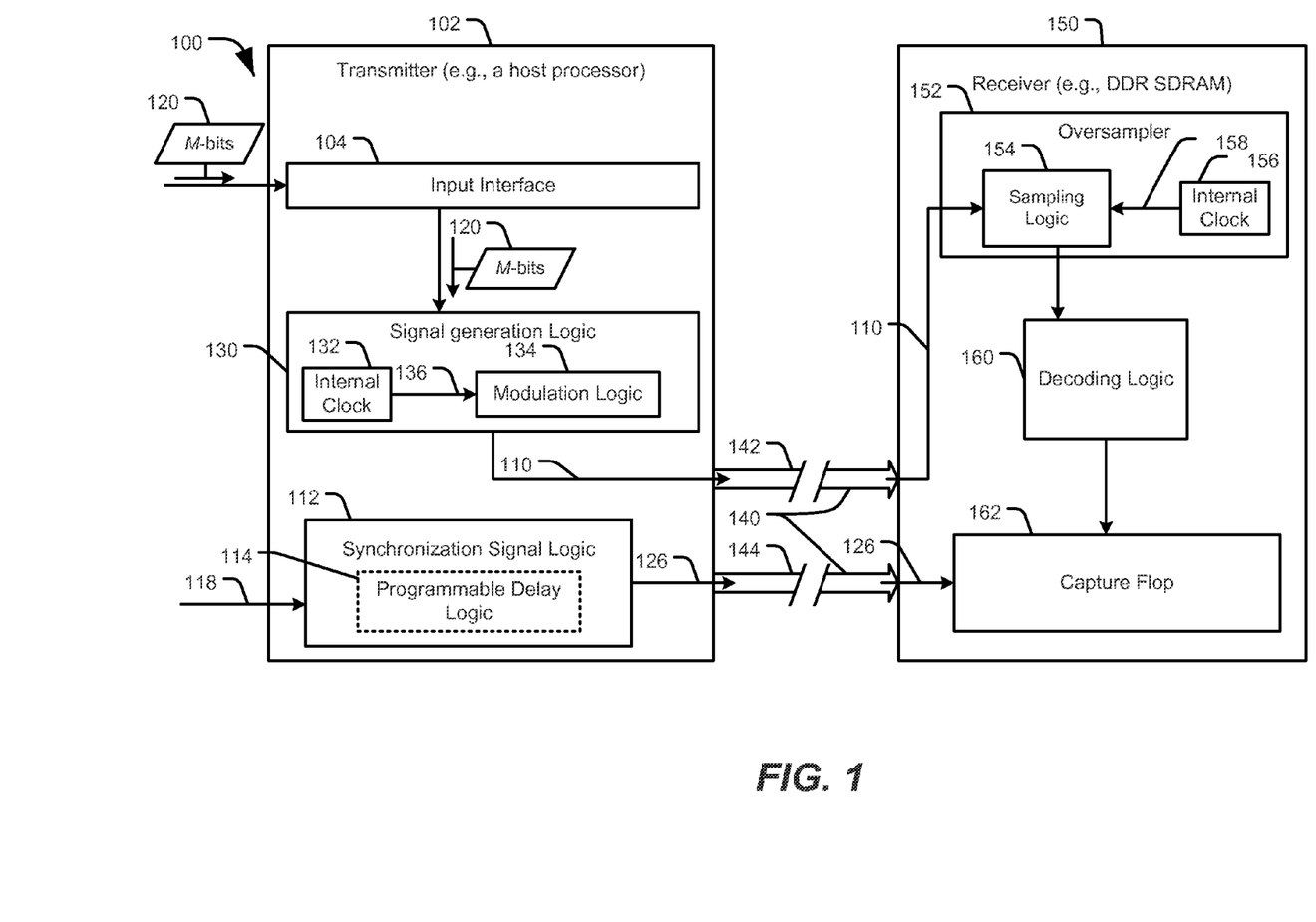
FIG. 1 is a block diagram of a particular illustrative embodiment of a system including a transmitter to generate a multi-bit signal that represents multiple bits to be transmitted during a time period corresponding to one-half a cycle of a synchronization signal and a receiver to determine multiple bits represented by the multi-bit signal received during the time period corresponding to one-half of a cycle of a synchronization signal.

Referring to FIG. 1, a block diagram of a particular illustrative embodiment of a system including a transmitter to generate a multi-bit signal that represents multiple bits to be transmitted during a time period corresponding to one-half a cycle of a synchronization signal and a receiver to determine multiple bits represented by the multi-bit signal received during the time period corresponding to one-half of a cycle of a synchronization signal is disclosed and generally designated 100. The system 100 includes a transmitter 102 (e.g., a transmitter of a host processor), a bus 140 (e.g., a synchronous interface), and a receiver 150 (e.g., a receiver of a DDR SDRAM memory device).

As shown in FIG. 1, the transmitter 102 includes an input interface 104, signal generation logic 130, and synchronization logic 112. The signal generation logic 130 includes modulation logic 134 and an internal clock 132. In a particular embodiment, the internal clock 132 may be a ring oscillator. In a particular embodiment, the synchronization logic 112 may include programmable delay logic 114. During operation, the transmitter 102 may receive multiple bits 120 at the input interface 104. The multiple bits 120 may include M-bits, where M>=two (2). The multiple bits 120 may correspond to data that is to be provided to a memory device (e.g., the DDR SDRAM memory device including the receiver 150). The input interface 104 may be configured to provide the multiple bits 120 to the signal generation logic 130.

The signal generation logic 130 may be configured to encode a multi-bit signal 110 that represents the multiple bits 120. The signal generation logic 130 may be configured to determine a symbol (not shown in FIG. 1) corresponding to the multiple bits and to encode the multi-bit signal 110 based the symbol. In a particular embodiment, the signal generation logic 130 may include a table, such as one of the tables described with reference to FIG. 3, and may be configured to determine the symbol corresponding to the multiple bits based on the table.

The modulation logic 134 may be configured to modulate a phase and a duty cycle of the multi-bit signal 110 based on the symbol. The phase of the multi-bit signal may correspond to whether an initial value of the multi-bit signal has a first value (e.g., a logical low value or a one (0)) or a second value (e.g., a logical high value or a one (1)). The duty cycle of the multi-bit signal may correspond to a duration of time that the multi-bit signal has the initial value before transitioning to a different value.

The modulation logic 134 may be responsive to the internal clock signal 136 received from the internal clock 132 during the modulation of the phase and the duty cycle of the multi-bit signal 110. For example, the internal clock signal 136 may include an oscillatory signal having a first frequency ($f$). The oscillatory signal may have a period (T), such that the oscillatory signal oscillates between a first value (e.g., a logical high value) and a second value (e.g., a logical low value) during a period of time corresponding to (1/$f$). The period (T) represents an amount of time required for the oscillatory signal to complete one cycle (e.g., to complete oscillation from the first value to the second value and back to the first value).

The symbol corresponding to the multiple bits 120 may be represented by $2^{(M-1)}$ bits. The modulation logic 134 may be configured to modulate the phase and the duty cycle of the multi-bit signal 110 such that two (2) bits of the $2^{(M-1)}$ bits are encoded within the multi-bit signal per period (T) (e.g., one bit of the $2^{(M-1)}$ bits per half-cycle) of the internal clock signal 136. The modulation logic 134 may be configured to provide the multi-bit signal 110 to the receiver 150 via the bus 140. Illustrative embodiments of modulating the phase and the duty cycle of a multi-bit signal are described with reference to FIGS. 2 and 3.

The synchronization signal logic 112 may be configured to generate the synchronization signal 126. In a particular embodiment, the synchronization signal 126 may be a data strobe signal (DQS) and may be generated based on an external clock signal 118 generated by an external clock (not shown in FIG. 1). In a particular embodiment, the external clock may include a system clock that is external to the transmitter 102 and the receiver 150. The synchronization signal 126 may have a second frequency ($f'$) that is less than the first frequency ($f$) of the internal clock signal 136. The synchronization signal 126 may have a second period (T'). The period (T') represents an amount of time required for the synchronization signal to complete one cycle. The synchronization signal 126 may be provided to the receiver 150 via the bus 140.

As shown in FIG. 1, the bus 140 includes one or more data communication paths, such as a representative data communication path 142, one or more synchronization paths, such as a representative synchronization path 144. The modulation logic 134 may be configured to provide the multi-bit signal 110 to the receiver 150 via the data communication path 142, and the synchronization logic 112 may be configured to provide the synchronization signal 126 to the receiver 150 via the synchronization path 144.

As shown in the FIG. 1, the receiver 150 includes an oversampler 152, decoding logic 160, and a capture flop 162. The oversampler 152 includes sampling logic 154 and an internal clock 156. In a particular embodiment, the internal clock 156 may be a ring oscillator. The multi-bit signal 110 may be received at the receiver 150 via the data communication path 142 and provided to the oversample 152. The sampling logic 154 samples the multi-bit signal 110 based on an internal clock signal 158 that is provided by the internal clock 156. The internal clock signal 158 may include an oscillatory signal having a third frequency ($f''$). The oscillatory signal may have a period (T''), such that the oscillatory signal oscillates between a first value (e.g., a logical high value) and a second value (e.g., a logical low value) during a period of time corresponding to ($1/f''$). The period (T'') represents an amount of time required for the oscillatory signal to complete one cycle (e.g., to complete oscillation from the first value to the second value and back to the first value). In a particular embodiment, the third frequency ($f''$) of the internal clock signal nay be the same as the first frequency ($f$) of the internal clock signal 136.

The sampling logic 154 may be configured to sample the multi-bit signal 110 to determine one or more bits represented by the multi-bit signal 110. For example, as described with reference to the modulation logic 134, the multi-bit signal 110 may include a symbol represented by $2^{(M-1)}$ bits. The sampling logic 154 may be configured to sample the multi-bit signal 110 to determine the $2^{(M-1)}$ bits. In a particular embodiment, the sampling logic 154 may be configured to perform binary oversampling of the multi-bit signal 110. The binary oversampling may include determining a plurality of bits (e.g., the $2^{(M-1)}$ bits), where each of the plurality of bits is determined based on a duty cycle of the multi-bit signal 110. Because the third frequency ($f''$) corresponds to the first frequency ($f$), the sampling logic 154 is capable of detecting each of the $2^{(M-1)}$ bits of the multi-bit signal 110 (i.e., detecting the symbol corresponding to the multiple bits 120). The sampling logic 154 may provide the detected $2^{(M-1)}$ bits to the decoding logic 160.

The decoding logic 160 may be configured to receive the $2^{(M-1)}$ its from the sampling logic and to determine a symbol represented by the $2^{(M-1)}$ bits. The decoding logic 160 may be configured to determine multiple bits (e.g., the multiple bits 120) based on the symbol. In a particular embodiment, the decoding logic 160 may include a table, such as the table described with reference to the signal generation logic 130. The table may be used by the decoding logic 160 to determine the multiple bits corresponding to the symbol. The decoding logic 160 may be configured to provide the multiple bits to the capture flop 162.

The capture flop 162 may be configured to store the multiple bits (e.g., the multiple bits 120) until the synchronization signal 126 indicates that the multiple bits are to be written to one or more storage elements (not shown in FIG. 1) of a memory device that is coupled to or that includes the receiver 150. In a particular embodiment, the synchronization signal logic 112 includes programmable delay logic 114. The programmable delay logic 114 may be configured to calibrate the synchronization signal 126. Calibration of the synchronization signal 126 may be performed to synchronize operations of the transmitter 102 and the receiver 150. For example, the programmable delay logic 114 may be configured to calibrate the synchronization signal 126, such that the capture flop 162 captures the values of the multiple bits (e.g., the multiple bits 120) only after the complete symbol encoded within the multi-bit signal 110 has been decoded into its corresponding multiple bits by the decoding logic 160.

Although not illustrated in FIG. 1, the transmitter 102 may include circuitry or other logic configured to implement one or more of the functions and operations described with reference to the receiver 150. Additionally, the receiver 150 may include circuitry or other logic configured to implement one or more of the functions and operations described with reference to the transmitter 102. Thus, a memory device (e.g., a DDR SDRAM memory device) including the receiver 150 may also include a transmitter configured to transmit multiple bits (e.g., multiple bits read from one or more storage elements of the memory device) as a multi-bit signal to the processor that includes the transmitter 102. The processor may include a receiver configured to receive the multi-bit signal and to decode the multi-bit signal into the multiple bits (e.g., the multiple bits read from the one or more storage elements of the memory device). Additionally, although only a single multi-bit signal (e.g., the multi-bit signal 110) is illustrated in FIG. 1, the transmitter 102 may be configured to generate a plurality of multi-bit signals and to transmit the plurality of multi-bit signals to the receiver 150 via the one or more data communication paths of the bus 140. Additionally, although only a single synchronization signal (e.g., the synchronization signal 126) is illustrated in FIG. 1, the synchronization signal logic 112 may generate a plurality of synchronization signals to synchronize receiving and transmitting operations between the transmitter 102 and the receiver 150. For example, a first synchronization signal may be used for a first number of data communication paths of the plurality of data communication paths of the bus 140 and a second synchronization signal may be used for a second number of data communication paths of the plurality of data communication paths of the bus 140.

By encoding the multiple bits 120 using the signal generation logic 130, the number of bits that may be transmitted from the transmitter 102 to the receiver 150 via the bus 140 during each one-half cycle of the synchronization signal 126 may be increased, as compared to systems that transmit a single bit during each one-half cycle of the synchronization signal 126. Thus, data throughput increases may be realized without significantly increasing the complexity and manufacturing costs of a memory device that includes the receiver 150, a processor that includes the transmitter 102, and a circuit board that includes a portion of the bus 140.

Figure 2:
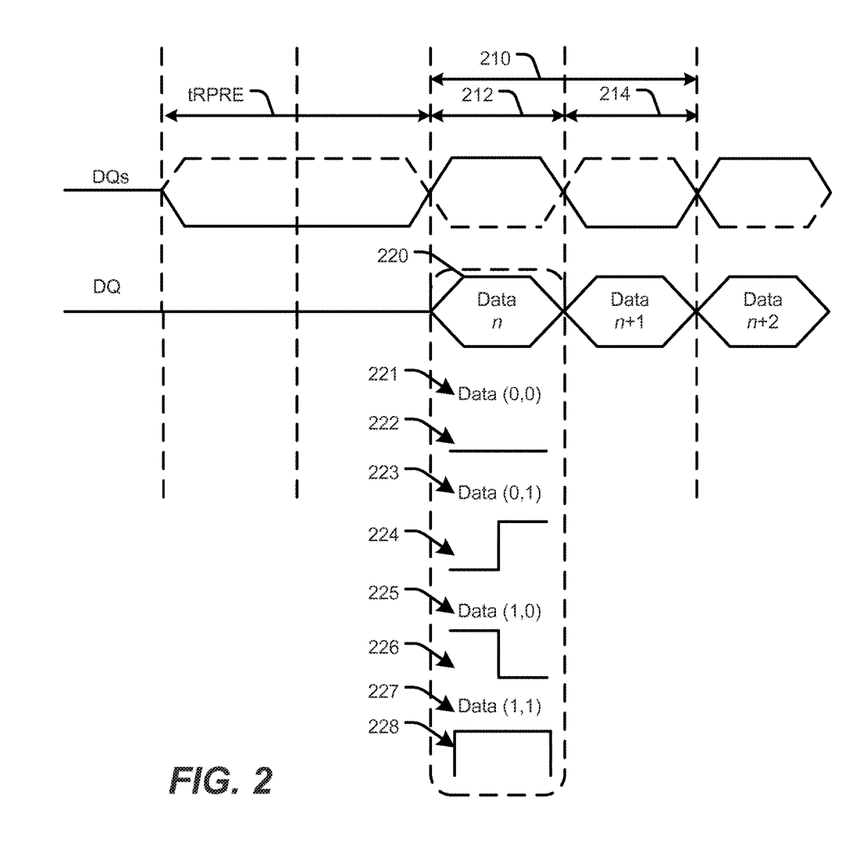
FIG. 2 is a timing diagram illustrating a multi-bit signal that represents multiple bits to be transmitted during a time period corresponding to one-half a cycle of a synchronization signal.

Referring to FIG. 2, a timing diagram illustrating a multi-bit signal that represents multiple bits to be transmitted during a time period corresponding to one-half a cycle of a synchronization signal is shown and generally designated 200. In FIG. 2, the timing diagram 200 includes a synchronization signal DQs (e.g., a strobe signal) and a multi-bit signal DQ (e.g., a data signal). The synchronization signal DQs may correspond to the synchronization signal 126 of FIG. 1, and the data signal DQ may correspond to the multi-bit signal 110 of FIG. 1.

As shown in FIG. 2, the synchronization signal DQs may have a cycle 210 that includes a first portion 212 and a second portion 214. The first portion 212 of the cycle 210 of the synchronization signal DQs may he a first half of the cycle 210 and the second portion 214 may be a second half of the cycle 210. As shown in FIG. 2, during the first portion 212 of the synchronization signal DQs, the multi-bit signal DQ may include data 220. The data 220 may include M-bits of data (e.g., the M-bits 120 of FIG. 1). In FIG. 2, the data 220 comprises two (2) bits of data (e.g., M=two (2)).

When M=two (2), the two (2) bits may have corresponding values of "0,0", represented by the data 221, a value of "0,1", represented by the data 223, a value of "1,0", represented by the data 225, a value of "1,1", represented by the data 227. Each of the data 221, 223, 225, 227 may correspond to a particular symbol, such as the symbols 222, 224, 226, 228, shown in FIG. 2. To illustrate, the data 221 corresponds to the symbol 222, the data 223 corresponds to the symbol 224, the data 225 corresponds to the symbol 226, and the data 227 corresponds to the symbol 228.

In a particular embodiment, the multi-bit signal DQ may be generated by signal generation logic 130 of FIG. 1. For example, when the multiple bits 120 correspond to the data 221, the signal generation logic 130 may determine that the symbol 222 corresponds to the data 221 (e.g., values "0 , 0"). The modulation logic 134 may perform modulation operations on the multi-bit signal DQ based on the symbol_ 222. The modulation operations may include modulating a phase of the multi-bit signal DQ and modulating a duty cycle of the multi-bit signal DQ. Modulating the phase of the multi-bit signal DQ may correspond to setting an initial value of the multi-bit signal DQ to a value of one (1) or zero (0). Modulating the duty cycle of the multi-bit signal DQ may correspond to changing the value of multi-bit signal DQ from the initial value to a second value for a remainder of the cycle of the multi-bit signal.

To illustrate, the symbol 222 corresponds to a multi-bit signal DQ having a phase modulation of zero (0) and a duty cycle of zero percent (0%). Thus, when the multiple bits correspond to the symbol 222, the multi-bit signal has an initial value of zero (0) and may remain at the initial value for the entire cycle of the multi-bit signal DQ. The symbol 224 corresponds to a multi-bit signal DQ having a phase of zero (0) and a duty cycle of fifty percent (50%). Thus, when the multiple bits correspond to the symbol 224, the multi-bit signal has an initial value of zero (0). The multi-bit signal DQ may remain at the initial value for a first one-half of the cycle of the multi-bit signal DQ and may transition from the initial value to a second value (e.g., one (1)) for a second one-half cycle of the multi-bit signal DQ. The symbol 226 corresponds to a multi-bit signal DQ having a phase of one (1) and a duty cycle of fifty percent (50%). Thus, when the multiple bits correspond to the symbol 226, the multi-bit signal has an initial value of one (1). The multi-bit signal DQ may remain at the initial value for a first one-half of the cycle of the multi-bit signal DQ and may transition from the initial value to a second value (e.g., zero (0)). The symbol 228 corresponds to a multi-bit signal DQ having a phase modulation of one (1) and a duty cycle of one-hundred percent (100%). Thus, when the multiple bits correspond to the symbol 228, the multi-bit signal has an initial value of one (1) and may remain at the initial value for the entire cycle of the multi-bit signal DQ.

Figure 3:
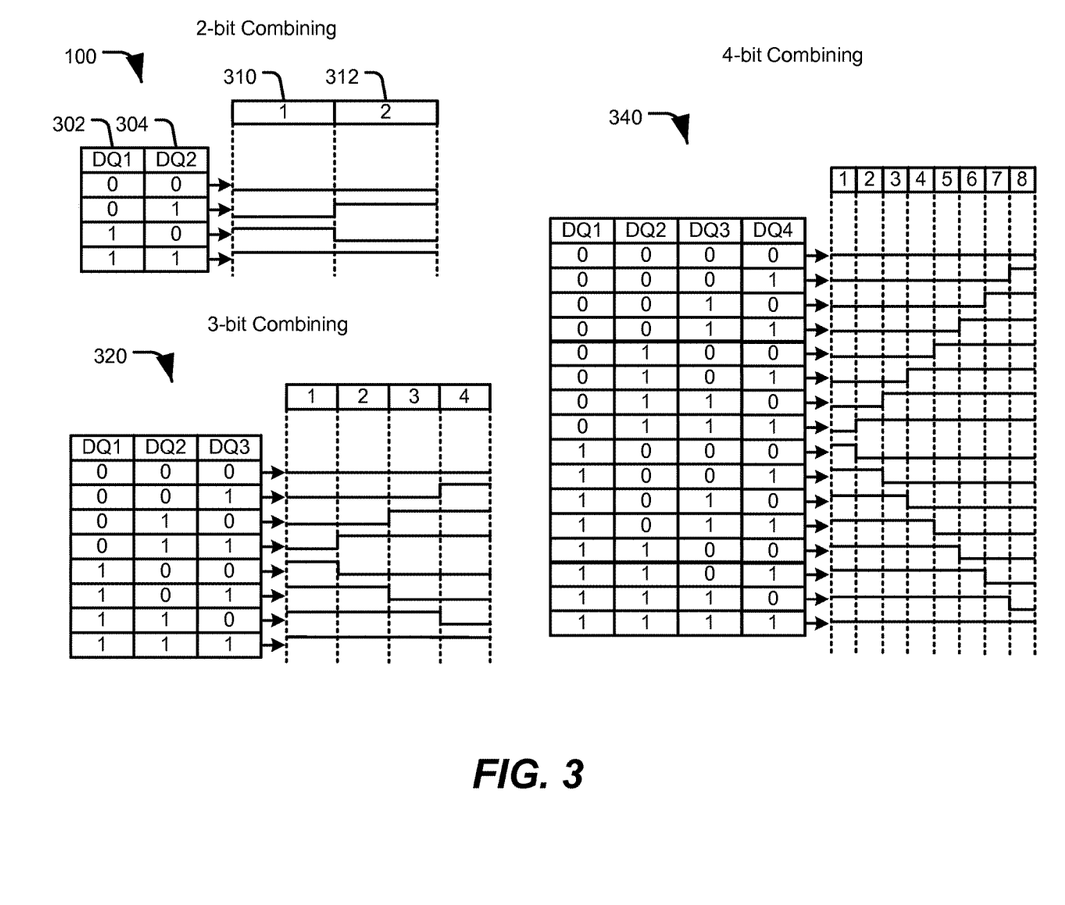
FIG. 3 includes illustrative embodiments of symbols for use in transmitting M-bits of data during a time period corresponding to one-half a cycle of a synchronization signal.

Referring to FIG. 3, illustrative embodiments of symbols for use in transmitting M-bits of data during a time period corresponding to one-half a cycle of a synchronization signal are shown and are designated 300, 320, and 340. When M=two (2), a data signal (e.g., the multi-bit signal 110 of FIG. 1 or the data signal 204 of FIG. 2) may be generated according to a table 300. As shown in the table 300, the M-bits include a first bit 302 and a second bit 304 that are to be transmitted from a transmitter (e.g., the transmitter 102 of FIG. 1) to a receiver (e.g., the receiver 150 of FIG. 1). Each of the rows of M-bits has a corresponding symbol (indicated by an arrow) that includes a first portion 310 and a second portion 312.

In a particular embodiment, a transmitter (e.g., the transmitter 102 of FIG. 1) may not include a symbol table and may not determine a symbol corresponding to multiple bits to be transmitted to a receiver (e.g., the receiver 150 of FIG. 1). For example, as shown in FIG. 2, when M=two (2), the first portion 310 and the second portion 312 of each symbol of the table 300 correspond to the values of the first bit 302 and the second bit 304, respectively. Thus, when M=two (2), the modulation logic may modulate a multi-bit signal (e.g., the multi-bit signal 110) based on the multiple bits rather than performing a lookup using a symbol table.

When symbol tables are used, each table may include a number of symbols (S), where $S=2^{(M)}$, where M corresponds to the number of bits of data to be transmitted in a one-half cycle of the synchronization signal. In FIG. 3, the table 320 illustrates symbols that may be used to transmit three (3) bits of data (M=three (3)). The table 340 illustrates symbols that may be used to transmit four (4) bits of data (M=four (4)). As shown in FIG. 3, each of the symbols may be divided into $2^{(M-1)}$ portions. For example, the table 320 illustrates symbols corresponding to three (3) bits of data (e.g., M=3), where each of the corresponding symbols is divided into four portions (e.g., $2^{(3-1)}=4$). In a particular embodiment, the symbols included in the tables 300, 320, 340 may be stored as $2^{(M-1)}$ bits, each bit representing a value (e.g., a zero (0) or a one (1)) of the multi-bit signal during a particular one of the $2^{(M-1)}$ portions. Thus, sampling logic (e.g., the sampling logic 154) may be configured to determine $2^{(M-1)}$ bits represented by the multi-bit signal and may provide the $2^{(M-1)}$ bits to decoding logic (e.g., the decoding logic 160). The decoding logic may determine the symbol based on the $2^{(M-1)}$ bits received from the sampling logic. Based on the symbol represented by the $2^{(M-1)}$ bits, the decoding logic may determine multiple bits (e.g., the multiple bits 120) represented by the multi-bit signal.

As shown in FIG. 3, each of the symbols includes at most two transitions (e.g., from a low value to a high value or from a high value to a low value). A first transition may correspond to initializing the multi-bit signal to an initial value (e.g., a zero (0) or a one (1)). Initializing the multi-bit signal may correspond to phase modulation of the multi-bit signal and may be performed by modulation logic (e.g., the modulation logic 134 of FIG. 1). The first transition may occur on a first edge (e.g., a leading edge or a falling edge) of a synchronization signal (e.g., the synchronization signal 126 of FIG. 1). A second transition may correspond to duty cycle modulation of the multi-bit signal and may be performed by the modulation logic (e.g., the modulation logic 134 of FIG. 1). The second transition may occur between the first edge (e.g., the leading edge or the falling edge) of the synchronization signal and a second edge (e.g., the falling edge or the leading edge) of the synchronization signal. Stated another way, each symbol may include at most one transition during a period between the leading edge and the falling edge of the synchronization signal after the multi-bit signal has been initialized to the initial value.

Each of the symbols illustrated in the tables 300, 320, 340 may be transmitted during a portion (e.g., the first portion 212 or the second portion 214 of FIG. 2) of a cycle (e.g., the cycle 210 of FIG. 2) of a synchronization signal (e.g., the synchronization signal DQs of FIG. 2). Thus, multiple bits may be encoded within a multi-bit signal and transmitted during each one-half of a cycle of the synchronization signal without increasing a frequency of the synchronization signal. Additionally, the multi-bit signal may be received and the multiple bits may be decoded during each one-half of a cycle of the synchronization signal without increasing a frequency of the synchronization signal.

Figure 4:
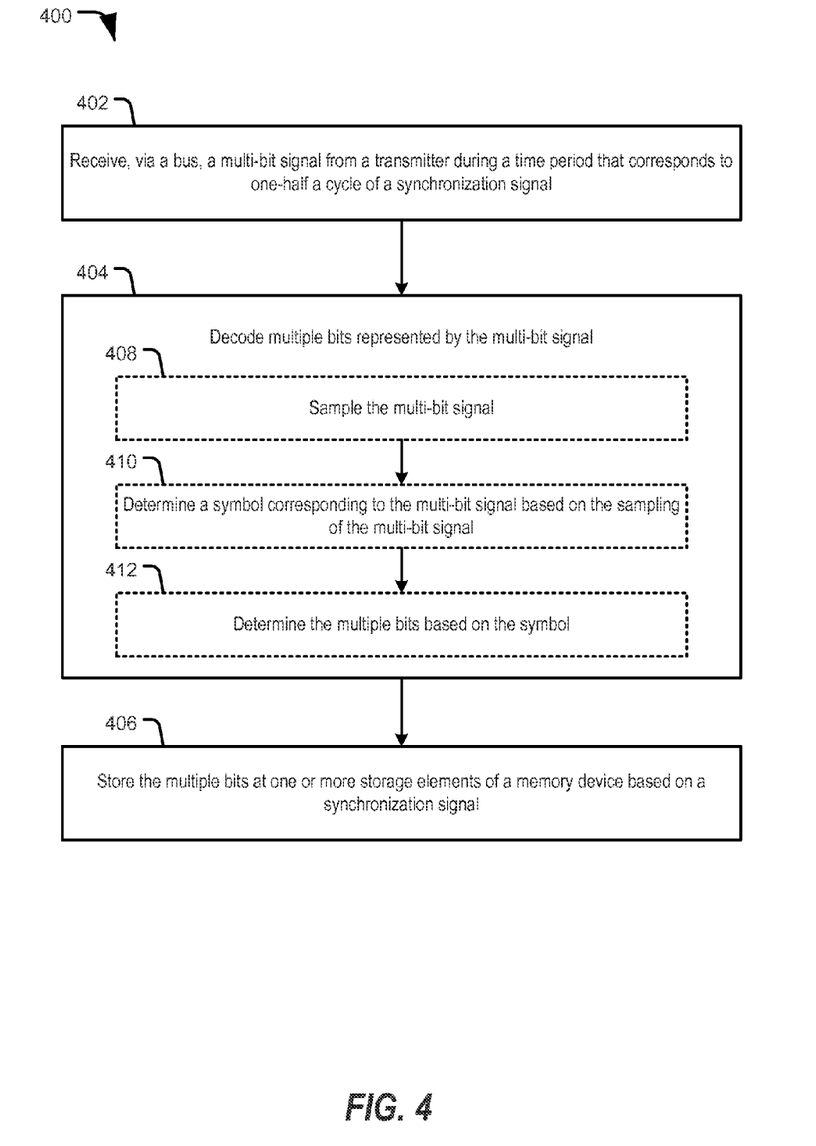
FIG. 4 is a flowchart of a particular illustrative embodiment of a method of determining multiple bits represented by a multi-bit signal received during a time period corresponding to one-half of a cycle of a synchronization signal.

Referring to FIG. 4, a flowchart of a particular illustrative embodiment of a method of determining multiple bits represented by a multi-bit signal received during a time period corresponding to one-half of a cycle of a synchronization signal is shown and designated 400. The method 400 includes, at 402, receiving, via a bus, a multi-bit signal from a transmitter during a time period that corresponds to one-half a cycle of a synchronization signal. At 404, the method 400 includes decoding multiple bits represented by the multi-bit signal. Decoding the multiple bits represented by the multi-bit signal may include, at 408, sampling the multi-bit signal and, at 410, determining a symbol corresponding to the multi-bit signal based on the sampling of the multi-bit signal. Decoding the multiple bits represented by the multi-bit signal may include, at 412, determining the multiple based on the symbol. At 406, the method includes storing the multiple bits at one or more storage elements of a memory device based on a synchronization signal.

The method 400 of FIG. 4 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 4 can be performed by a processor that executes instructions, as described with respect to FIG. 6.

Figure 5:
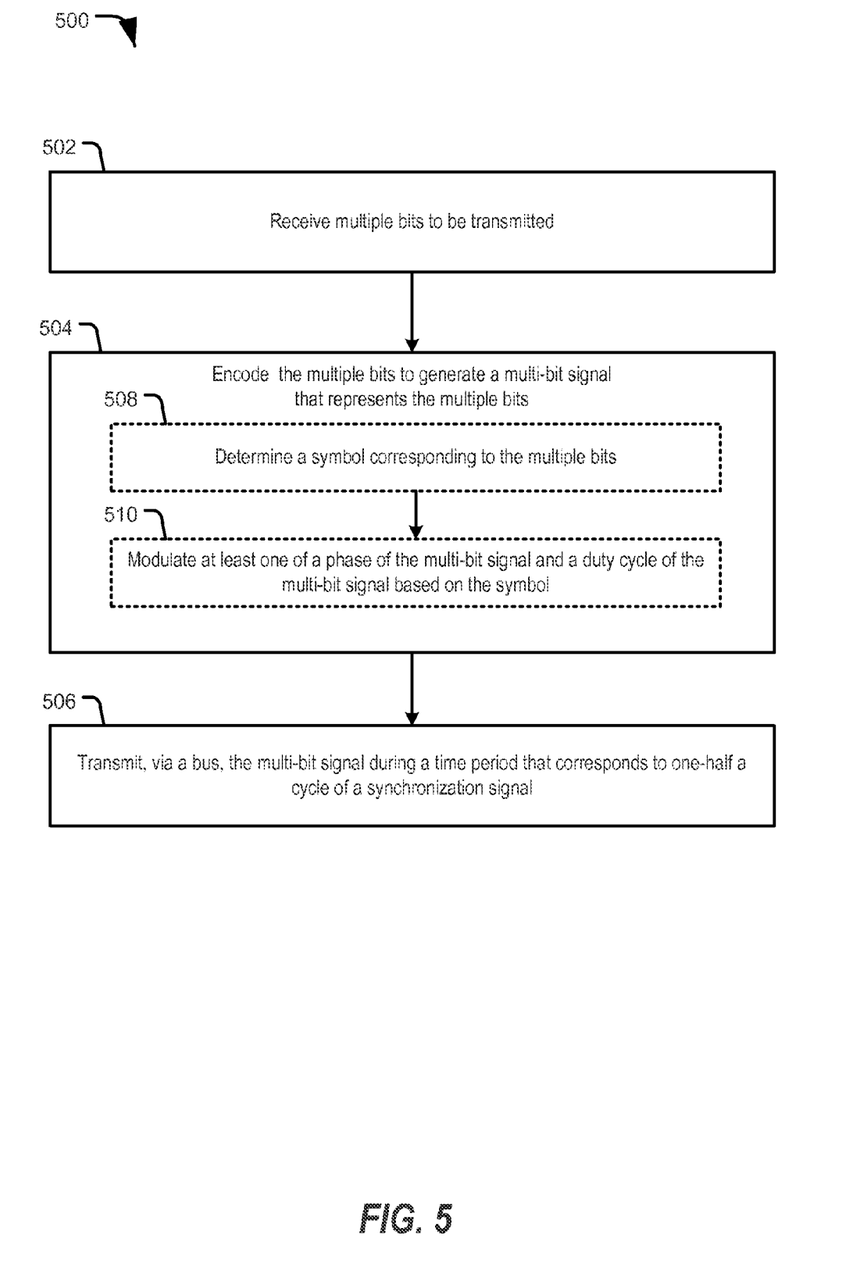
FIG. 5 is a flowchart of a particular illustrative embodiment of a method of generating a multi-bit signal that represents multiple bits to be transmitted during a time period corresponding to one-half of a cycle of a synchronization signal.

Referring to FIG. 5, a flowchart of a particular illustrative embodiment of a method of generating a multi-bit signal that represents multiple bits to be transmitted during a time period corresponding to one-half of a cycle of a synchronization signal is shown and designated 500. The method 500 includes, at 502, receiving multiple bits to be transmitted. At 504, the method 500 includes encoding the multiple bits to generate a multi-bit signal that represents the multiple bits. Generating the multi-bit signal that represents the multiple bits may include, at 508, determining a symbol corresponding to the multiple bits, and, at 510, modulating at least one of a phase of the multi-bit signal and a duty cycle of the multi-bit signal based on the symbol. The method 500 includes, at 506, transmitting, via a bus, the multi-bit signal during a time period that corresponds to one-half a cycle of a synchronization signal.

The method of FIG. 5 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 5 can be performed by a processor that executes instructions, as described with respect to FIG. 6.

Figure 6:
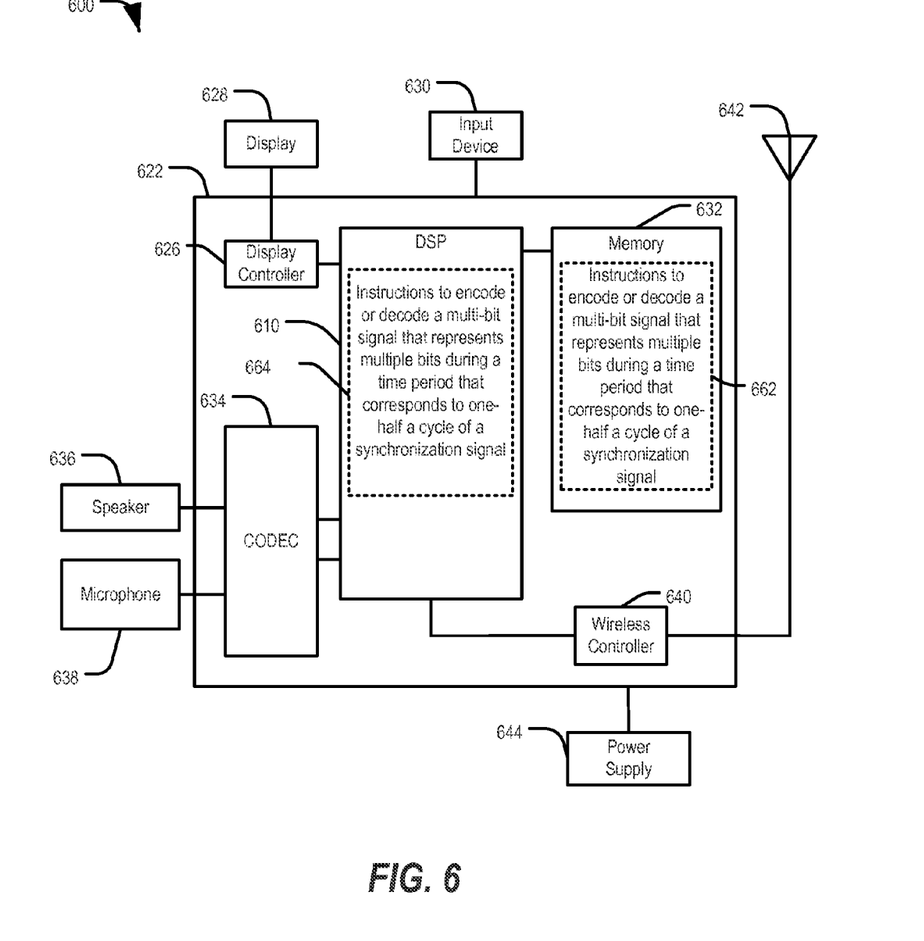
FIG. 6 is a block diagram of a particular illustrative embodiment of a wireless communication device configured to encode and decode a multi-bit signal that represents multiple bits during a time period corresponding to one-half a cycle of a synchronization signal.

Referring to FIG. 6, a block diagram of a particular illustrative embodiment of a wireless communication device configured to encode and decode a multi-bit signal that represents multiple bits during a time period corresponding to one-half a cycle of a synchronization signal is depicted and generally designated 600. The device 600 includes a processor, such as a digital signal processor (DSP) 610, coupled to a memory 632. The DSP 610 and the memory 632 may be configured to encode and/or decode a multi-bit signal that represents multiple bits during a time period that corresponds to one-half a cycle of a synchronization signal. In an illustrative embodiment, the multi-bit signal may correspond to the multi-bit signal 110 of FIG. 1, the multi-bit signal DQ of FIG. 2, and the DSP 610 and the memory 632 may be configured to perform one or more of the operations or functions described with reference to FIGS. 1-3, or may operate according to the methods of FIG. 4 and/or FIG. 5, or any combination thereof.

In a particular embodiment, the DSP 610 may include instructions 664, that when executed by the DSP 610, cause the DSP 610 to encode and/or decode a multi-bit signal that represents multiple bits during a time period that corresponds to one-half a cycle of a synchronization signal. For example, the instructions 664, when executed by the DSP 610, may cause the DSP 610 to decode the multi-bit signal into multiple bits as described with reference to the receiver 150 of FIG. 1 and the method of FIG. 4. The instructions 664 may include instructions that, when executed by the DSP 610, cause the DSP 610 to decode the multi-bit signal using one or more tables, such as the symbol tables 300, 320, 340 described with reference to FIG. 3. The instructions 664 may also include instructions that, when executed by the DSP 610, cause the DSP 610 to encode multiple bits within a multi-bit signal as described with reference to the transmitter 102 of FIG. 1 and the method of FIG. 5. The instructions 664 may include instructions that, when executed by the DSP 610, cause the DSP 610 to decode the multi-bit signal using one or more tables, such as the symbol tables 300, 320, 340 described with reference to FIG. 3.

In a particular embodiment, the memory 632 may include instructions 662, that when executed by a memory controller of the memory 632, cause the memory controller to encode and/or decode a multi-bit signal that represents multiple bits during a time period that corresponds to one-half a cycle of a synchronization signal. For example, the instructions 662, when executed by the memory controller of the memory 632, may cause the memory controller to decode the multi-bit signal into multiple bits as described with reference to the receiver 150 of FIG. 1 and the method of FIG. 4. The instructions 662 may include instructions that, when executed by the memory controller of the memory 632, cause the memory controller decode the multi-bit signal using one or more tables, such as the symbol tables 300, 320, 340 described with reference to FIG. 3. The instructions 662 may also include instructions that, when executed by the memory controller of the memory 632, cause the memory controller to encode multiple bits within a multi-bit signal as described with reference to the transmitter 102 of FIG. 1 and the method of FIG. 5. The instructions 662 may include instructions that, when executed by the memory controller of the memory 632, cause the memory controller to decode the multi-bit signal using one or more tables, such as the symbol tables 300, 320, 340 described with reference to FIG. 3.

FIG. 6 also shows a display controller 626 that is coupled to the digital signal processor 610 and to a display 628. A coder/decoder (CODEC) 634 can also be coupled to the digital signal processor 610. A speaker 636 and a microphone 638 can be coupled to the CODEC 634.

FIG. 6 also indicates that a wireless controller 640 can be coupled to the digital signal processor 610 and to a wireless antenna. 642. In a particular embodiment, the DSP 610, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the wireless antenna 642, and the power supply 644 are external to the system-on-chip device 622. However, each of the display 628, the input device 630, the speaker 636, the microphone 638, the wireless antenna 642, and the power supply 644 can be coupled to a component of the system-on-chip device 622, such as an interface or a controller.

In conjunction with the described embodiments, a system is disclosed that may include means for receiving multiple bits to be transmitted, such as the input interface 104 of FIG. 1, one or more other devices or circuits configured to receive multiple bits to be transmitted, or any combination thereof The system may also include means for encoding the multiple bits to generate a multi-bit signal that represents the multiple bits, such as the signal generation logic 130 of FIG. 1 or the modulation logic 134 of FIG. 1, one or more other devices or circuits configured to generating a multi-bit signal that represents the multiple bits, or any combination thereof. The system my also include means for determining a symbol corresponding to the multiple bits, such as the signal generation logic 130 of FIG. 1 or the modulation logic 134 of FIG. 1, one or more other devices or circuits configured to determine a symbol corresponding to the multiple bits. The system may also include means for modulating at least one of a phase of the multi-bit signal and a duty cycle of the multi-bit signal based on the symbol, such as the modulation logic 134 of FIG. 1, one or more other devices or circuits configured to modulate at least one of a phase of the multi-bit signal and a duty cycle of the multi-bit signal based on the symbol. The system may also include means for transmitting, via a bus, the multi-bit signal during a time period that corresponds to one-half of a cycle of a synchronization signal, such as the transmitter 102 of FIG. 1 or the modulation logic 134 of FIG. 1, one or more other devices or circuits configured to transmit, via a bus, the multi-bit signal during a time period that corresponds to one-half of a cycle of a synchronization signal, or any combination thereof The system may also include means for generating a first clock signal, such as the internal clock 132 of FIG. 1, one or more other devices or circuits configured to generate a first clock signal, or any combination thereof. The system may also include means for generating a synchronization signal, such as the synchronization logic 112 of FIG. 1, one or more other devices or circuits configured to generate a synchronization signal, or any combination thereof. The system may also include means for determining a programmable delay of a synchronization signal, such as the programmable delay logic 114 of FIG. 1, one or more other devices or circuits configured to determine a programmable delay of a synchronization signal, or any combination thereof.

The system may also include means for receiving, via a bus, a multi-bit signal from a transmitter during a time period that corresponds to one-half of a cycle of a synchronization signal, such as the oversampler 152 of FIG. 1, one or more other devices or circuits configured to receive, via a bus, a multi-bit signal from a transmitter during a time period that corresponds to one-half of a cycle of a synchronization signal, or any combination thereof. The system may also include means for sampling the multi-bit signal, such as the sampling logic 154 of FIG. 1, one or more other devices or circuits configured to sample the multi-bit signal, or any combination thereof. The system may also include means for determining a symbol corresponding to the multi-bit signal, such as the decoding logic 160 of FIG. 1, one or more other devices or circuits configured to determine a symbol corresponding to the multi-bit signal, or any combination thereof. The system may also include means for decoding multiple bits represented by the multi-bit signal, such as the decoding logic 160 of FIG. 1, one or more other devices or circuits configured to determine multiple bits represented by the multi-bit signal, or any combination thereof The system may also include means for storing the multiple bits at one or more storage elements of a memory device, such as the capture flop 162 of FIG. 1, one or more other devices or circuits configured to store the multiple bits at one or more storage elements of a memory device, or any combination thereof. The system may also include means for generating a first clock signal, such as the internal clock 156 of FIG. 1, one or more other devices or circuits configured to generate a first clock signal, or any combination thereof.

Figure 7:
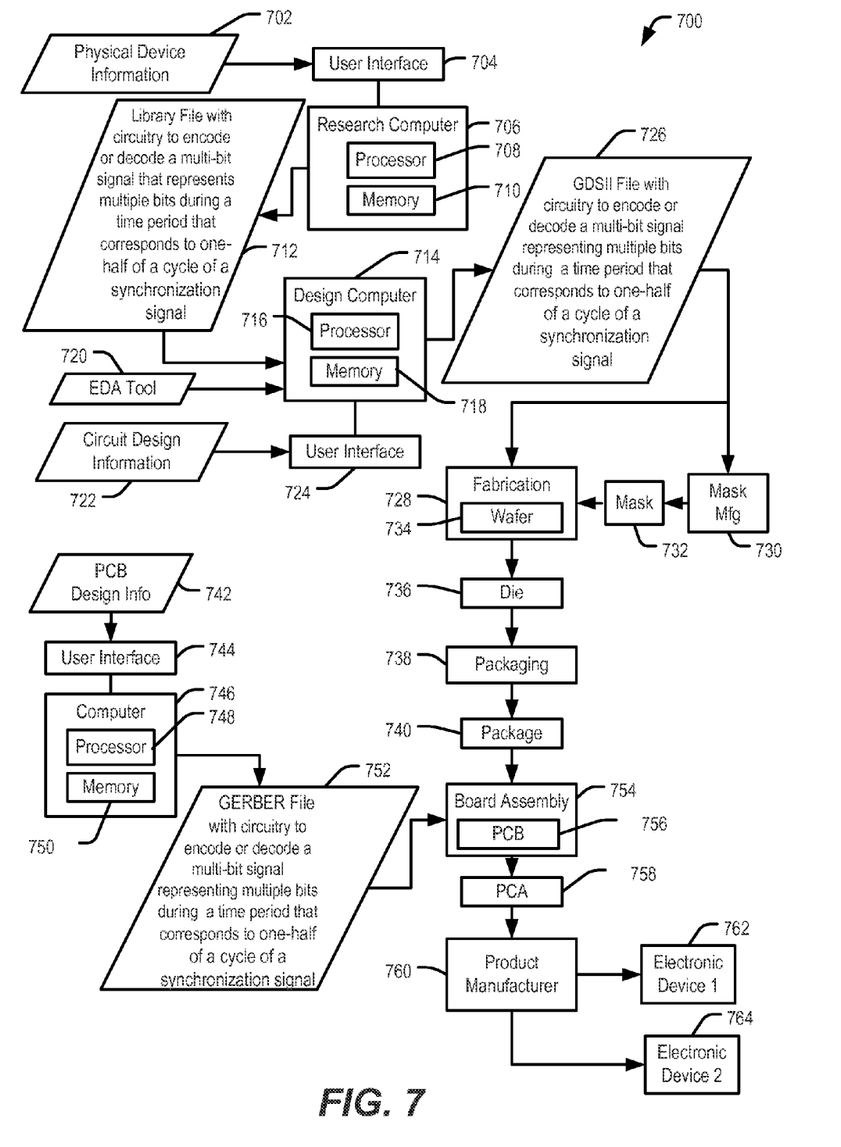
FIG. 7 is a data flow diagram of a particular illustrative embodiment of a manufacturing process to manufacture electronic devices configured to encode and decode a multi-bit signal that represents multiple bits during a time period corresponding to one-half a cycle of a synchronization signal.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 7 depicts a data flow diagram of a particular illustrative embodiment of a manufacturing process 700 to manufacture electronic devices configured to encode and decode a multi-bit signal that represents multiple bits during a time period corresponding to one-half a cycle of a synchronization signal.

Physical device information 702 is received at the manufacturing process 700, such as at a research computer 706. The physical device information 702 may include design information representing at least one physical property of a semiconductor device, such as the transmitter 102 of FIG. 1, the receiver 150 of FIG. 1, one or more of the tables 300, 320, 340 of FIG. 3, or any combination thereof For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including a device that includes the transmitter 102 of FIG. 1, the receiver 150 of FIG. 1, one or more of the tables 300, 320, 340 of FIG. 3, or any combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including the transmitter 102 of FIG. 1, the receiver 150 of FIG. 1, one or more of the tables 300, 320, 340 of FIG. 3, or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as the transmitter 102 of FIG. 1, the receiver 150 of FIG. 1, one or more of the tables 300, 320, 340 of FIG. 3, or any combination thereof. To illustrate, the circuit design property may include identification of particular circuits and relationships to other elements in a circuit design, positioning information, feature size information, interconnection information, or other information representing a physical property of a semiconductor device.

The design computer 711 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the transmitter 102 of FIG. 1, the receiver 150 of FIG. 1, one or more of the tables 300, 320, 340 of FIG. 3, or any combination thereof, in addition to other circuits or information. To illustrate, the data file may include information corresponding to a system-on-chip (SOC) that includes the transmitter 102 of FIG. 1, the receiver 150 of FIG. 1, one or more of the tables 300, 320, 340 of FIG. 3, and that also includes additional electronic circuits and components within the SOC.

The GDSII file 726 may be received at a fabrication process 728 to manufacture the transmitter 102 of FIG. 1, the receiver 150 of FIG. 1, one or more of the tables 300, 320, 340 of FIG. 3, or any combination thereof, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, which may be tested and separated into dies, such as a representative die 736. The die 736 includes a circuit including a device that includes the transmitter 102 of FIG. 1, the receiver 150 of FIG. 1, one or more of the tables 300, 320, 340 of FIG. 3, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the transmitter 102 of FIG. 1, the receiver 150 of FIG. 1, one or more of the tables 300, 320, 340 of FIG. 3, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the transmitter 102 of FIG. 1, the receiver 150 of FIG. 1, one or more of the tables 300, 320, 340 of FIG. 3, or any combination thereof In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer, into which the transmitter 102 of FIG. 1, the receiver 150 of FIG. 1, and/or one or more of the tables 300, 320, 340 of FIG. 3 is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof Although FIG. 7 illustrates remote units according to teachings of the disclosure, the disclosure is not limited to these illustrated units. Embodiments of the disclosure may be suitably employed in any device which includes active integrated circuitry including memory and on-chip circuitry.

A device that includes the transmitter 102 of FIG. 1, the receiver 150 of FIG. 1, one or more of the tables 300, 320, 340 of FIG. 3, or any combination thereof, may be fabricated, processed, and incorporated into an electronic device, as described in the illustrative process 700. One or more aspects of the embodiments disclosed with respect to FIGS. 1-6 may be included at various processing stages, such as within the library file 712, the COSH file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof Although various representative stages of production from a physical device design to a final product are depicted, in other embodiments fewer stages may be used or additional stages may be included. Similarly, the process 700 may be performed by a single entity or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:
1. A method of encoding bits, the method comprising:
receiving, at a signal generation logic, multiple bits to be transmitted;
encoding, based on a clock signal of a first clock internal to the signal generation logic, the multiple bits to generate a multi-bit signal that represents the multiple bits;
transmitting, via a bus, the multi-bit signal during a time period that corresponds to one-half of a cycle of a synchronization signal, wherein the time period is determined based on a second clock signal that is distinct from the clock signal; and
transmitting, by synchronization signal logic, the synchronization signal via the bus, wherein the synchronization signal is generated based on the second clock signal, and wherein the second clock signal is generated by a second clock that is distinct from and external to the synchronization signal logic.

2. The method of claim 1, wherein the multi-bit signal is generated by performing at least a duty cycle modulation.

3. The method of claim 1, further comprising determining a symbol corresponding to the multiple bits, wherein the multi-bit signal is encoded based on the symbol, wherein the bus includes a plurality of data communication paths and a plurality of synchronization paths, wherein the synchronization signal is transmitted via one of the plurality of synchronization paths and corresponds to a number of data communication paths of the plurality of data communication paths via which the multi-bit signal is transmitted to a memory device.

4. The method of claim 3, further comprising modulating at least one of a phase of the multi-bit signal and a duty cycle of the multi-bit signal based on the symbol, and wherein the multi-bit signal includes at most two transitions during the time period.

5. The method of claim 1, wherein the synchronization signal has a first frequency that is less than a second frequency of the clock signal.

6. The method of claim 5, wherein the first clock comprises a ring oscillator.

7. The method of claim 1, wherein the multiple bits are received at a processor, wherein the processor is coupled to a memory via the bus, and wherein at least two multi-bit signals are encoded by the clock signal and are transmitted during a particular cycle of the synchronization signal.

8. An apparatus comprising:
an input interface configured to receive multiple bits to be transmitted; and
signal generation logic comprising an internal clock and configured to:
receive the multiple bits via the input interface;
encode, based on a clock signal generated by the internal clock, the multiple bits to generate a multi-bit signal that represents the multiple bits; and
transmit, via a bus including a plurality of data communication paths and a plurality of synchronization paths, the multi-bit signal during a time period that corresponds to one-half of a cycle of a synchronization signal, wherein the synchronization signal is generated based on a second clock signal that is distinct from the clock signal, and wherein the second clock signal is generated by a second clock that is distinct and external to synchronization signal logic.

9. The apparatus of claim 8, wherein the multi-bit signal is generated by performing phase modulation or duty cycle modulation.

10. The apparatus of claim 8, wherein the signal generation logic is further configured to determine a symbol corresponding to the multiple bits, wherein the signal generation logic is configured to encode the multi-bit signal based on the symbol.

11. The apparatus of claim 10, wherein the signal generation logic further comprises modulation logic configured to modulate at least one of a phase of the multi-bit signal and a duty cycle of the multi-bit signal based on the symbol, and wherein the multi-bit signal includes at most two transitions during the time period.

12. The apparatus of claim 11, further comprising synchronization signal logic, wherein the modulation logic is responsive to the clock signal during modulation of the multi-bit signal, wherein the synchronization signal logic is responsive to the second clock.

13. The apparatus of claim 12, further comprising a ring oscillator, the ring oscillator configured to generate the clock signal.

14. The apparatus of claim 8, wherein the input interface and the signal generation logic are integrated into at least one semiconductor die.

15. The apparatus of claim 14, wherein the at least one semiconductor die is integrated in a set top box, a music player, a video player, an entertainment unit, a navigation device, a communications device, a personal digital assistant, a fixed location data unit, a computer, or a combination thereof.

16. The apparatus of claim 8, wherein the input interface is coupled to a processor, and wherein the signal generation logic is coupled to a memory device via the bus.

17. The apparatus of claim 16, wherein the memory device comprises a double data rate (DDR) synchronous dynamic random access memory (SDRAM).

18. A non-transitory computer-readable medium comprising instructions that, when executed by a processor, cause the processor to:
receive, via a bus, a multi-bit signal from a transmitter during a time period that corresponds to one-half of a cycle of a synchronization signal, wherein the time period corresponding to one-half of the cycle of the synchronization signal is determined based on a second clock signal that is distinct from a first clock signal, the synchronization signal having a first frequency, and wherein the second clock signal is generated by a second clock that is external to the transmitter;
receive the synchronization signal from the transmitter via the bus, wherein the synchronization signal is distinct from the multi-bit signal;
decode multiple bits represented by the multi-bit signal based on the first clock signal that is distinct from the synchronization signal and the multi-bit signal, the first clock signal having a second frequency, and wherein the second frequency of the first clock signal is greater than a third frequency of the second clock signal; and
store the multiple bits at one or more storage elements of a memory device.

19. The non-transitory computer-readable medium of claim 18, wherein the multiple bits are decoded by sampling the multi-bit signal.

20. The non-transitory computer-readable medium of claim 18 wherein the second clock signal corresponds to the synchronization signal.

21. The non-transitory computer-readable medium of claim 18, wherein decoding the multiple bits further comprises determining a symbol corresponding to the multi-bit signal, and further comprising instructions that, when executed by the processor, cause the processor to sample the multi-bit signal, wherein the symbol is determined based on the sampling of the multi-bit signal.

22. The non-transitory computer-readable medium of claim 21, further comprising instructions that, when executed by the processor, cause the processor to generate the first clock signal, wherein the multi-bit signal is sampled at the second frequency corresponding to the first clock signal.

23. The non-transitory computer-readable medium of claim 18, the first frequency of the synchronization signal less than the second frequency of the first clock signal.

24. The non-transitory computer-readable medium of claim 18, wherein the memory device is coupled to the processor via the bus.

25. An apparatus comprising:
means for receiving multiple bits to be transmitted;
means for encoding, based on a clock signal, the multiple bits to generate a multi-bit signal that represents the multiple bits;
means for transmitting the multi-bit signal during a time period that corresponds to one-half of a cycle of a synchronization signal, wherein the time period is determined based on a second clock signal that is distinct from the clock signal; and
means for transmitting the synchronization signal, wherein the synchronization signal is generated based on the second clock signal, and wherein the second clock signal is generated by a second clock that is distinct from and external to the means for transmitting the synchronization signal.

26. The apparatus of claim 25, further comprising:
means for determining a symbol corresponding to the multiple bits, wherein the means for encoding generates the multi-bit signal based on the symbol; and
means for modulating at least one of a phase of the multi-bit signal and a duty cycle of the multi-bit signal based on the symbol.

27. The apparatus of claim 26, further comprising means for generating the clock signal, wherein the means for modulating is responsive to the clock signal during modulation of the multi-bit signal.

28. The apparatus of claim 27, wherein the means for generating the clock signal comprises a ring oscillator.

29. A method for decoding bits, the method comprising:
receiving, via a bus, a multi-bit signal from a transmitter during a time period that corresponds to one-half of a cycle of a synchronization signal, wherein the time period corresponding to one-half of the cycle of the synchronization signal is determined based on a second clock signal that is distinct from a first clock signal, the synchronization signal having a first frequency, and wherein the second clock signal is generated by a second clock that is external to the transmitter;
receiving the synchronization signal from the transmitter via the bus, wherein the synchronization signal is distinct from the multi-bit signal;
decoding multiple bits represented by the multi-bit signal based on the first clock signal that is distinct from the synchronization signal and the multi-bit signal, the first clock signal having a second frequency, and wherein the second frequency of the first clock signal is greater than a third frequency of the second clock signal; and
storing the multiple bits at one or more storage elements of a memory device based on the synchronization signal.

30. A method of fabricating a semiconductor device, the method comprising:

receiving a data file comprising design information corresponding to a semiconductor device; and fabricating the semiconductor device according to the design information, wherein the semiconductor device comprises:

an input interface configured to receive multiple bits to be transmitted; and signal generation logic comprising an internal clock and configured to:

receive the multiple bits via the input interface;

encode, based on a clock signal generated by the internal clock, the multiple bits to generate a multi-bit signal that represents the multiple bits; and transmit, via a bus including a plurality of data communication paths and a plurality of synchronization paths, the multi-bit signal during a time period that corresponds to one-half of a cycle of a synchronization signal, wherein the synchronization signal is generated based on a second clock signal that is distinct from the clock signal, and wherein the second clock signal is generated by a second clock that is distinct and external to synchronization signal logic.

31. The method of claim 30, wherein the data file includes a Graphic Data System (GDSII) format.

32. The method of claim 30, wherein the data file has a GERBER format.

33. The method of claim 1, further comprising transmitting, via the bus, a second multi-bit signal during a second time period, wherein the second time period corresponds to a second half of the cycle of the synchronization signal, and wherein the second multi-bit signal is encoded based on the clock signal.

34. The method of claim 1, wherein a second clock signal is distinct from the multi-bit signal.

35. The method of claim 34, wherein a second frequency of the clock signal is greater than a third frequency of the second clock signal.

* * * * *